United States Patent
Sohn et al.

(10) Patent No.: US 7,415,590 B2
(45) Date of Patent: *Aug. 19, 2008

(54) INTEGRATED CIRCUIT HAVING A MEMORY CELL ARRAY CAPABLE OF SIMULTANEOUSLY PERFORMING A DATA READ OPERATION AND A DATA WRITE OPERATION

(75) Inventors: Kyo-Min Sohn, Seongnam-si (KR); Young-Ho Suh, Suwon-si (KR)

(73) Assignee: Samsung Electronic Co., Ltd., Suwon-si (KR)

( * ) Notice: Subject to any disclaimer, the term of this patent is extended or adjusted under 35 U.S.C. 154(b) by 286 days.

This patent is subject to a terminal disclaimer.

(21) Appl. No.: 10/814,968

(22) Filed: Mar. 31, 2004

(65) Prior Publication Data

US 2004/0210733 A1 Oct. 21, 2004

(30) Foreign Application Priority Data

Apr. 15, 2003 (KR) .................. 10-2003-0023733

(51) Int. Cl.
*G06F 12/00* (2006.01)
*G06F 13/00* (2006.01)
*G06F 13/28* (2006.01)

(52) U.S. Cl. .................. 711/168; 711/104; 711/111; 711/112; 365/189.05; 365/189.07; 365/230.06; 365/230.03; 365/230.08; 365/233; 365/189.04; 365/230.05

(58) Field of Classification Search ......... 711/149–150, 711/168, 104, 111–112; 365/230.05, 189.04, 365/233, 230.08, 230.03, 189.05, 189.07, 365/230.06

See application file for complete search history.

(56) References Cited

U.S. PATENT DOCUMENTS

| | | | | | |
|---|---|---|---|---|---|
| 5,226,010 | A | * | 7/1993 | Glider et al. | 365/189.04 |
| 5,303,200 | A | * | 4/1994 | Elrod et al. | 365/230.05 |
| 5,598,554 | A | * | 1/1997 | Litaize et al. | 716/1 |
| 5,752,260 | A | * | 5/1998 | Liu | 711/129 |
| 5,818,786 | A | * | 10/1998 | Yoneda | 365/230.03 |
| 5,978,897 | A | * | 11/1999 | Nakagawa | 712/200 |
| 6,141,742 | A | * | 10/2000 | Favor | 711/220 |
| 6,202,128 | B1 | * | 3/2001 | Chan et al. | 711/131 |

(Continued)

FOREIGN PATENT DOCUMENTS

KR   2004-0036477   *   4/2004

*Primary Examiner*—Sanjiv Shah
*Assistant Examiner*—Yaima Campos
(74) *Attorney, Agent, or Firm*—F. Chau & Assoc., LLC

(57) ABSTRACT

An integrated circuit comprising a memory cell array capable of simultaneously performing data read and write operations is provided. The integrated circuit to which inputs and outputs (IOs) are separately provided and to which a write address and a read address are simultaneously input during one period of a clock signal comprises a plurality of memory blocks, the memory blocks comprising a plurality of sub-memory blocks, a plurality of data memory blocks corresponding to the memory blocks, and a tag memory controlling unit, which writes data to the memory blocks or reads data from the memory blocks in response to the write address or the read address, wherein access to the same sub-memory block is not simultaneously performed when the write address and the read address are the same.

13 Claims, 9 Drawing Sheets

U.S. PATENT DOCUMENTS

| | | | |
|---|---|---|---|
| 6,356,484 B2 * | 3/2002 | Dosaka et al. | 365/189.01 |
| 6,463,514 B1 * | 10/2002 | Ray et al. | 711/168 |
| 6,480,927 B1 * | 11/2002 | Bauman | 710/317 |
| 6,625,699 B2 * | 9/2003 | Cohen et al. | 711/150 |
| 7,093,062 B2 * | 8/2006 | Cioaca | 711/103 |
| 2003/0097529 A1 * | 5/2003 | Arimilli et al. | 711/141 |
| 2004/0085817 A1 * | 5/2004 | Kim et al. | 365/189.01 |

* cited by examiner

INTEGRATED CIRCUIT HAVING A MEMORY CELL ARRAY CAPABLE OF SIMULTANEOUSLY PERFORMING A DATA READ OPERATION AND A DATA WRITE OPERATION

CROSS-REFERENCE TO RELATED APPLICATIONS

This application claims priority to Korean Patent Application No. 2003-23733, filed on Apr. 15, 2003, in the Korean Intellectual Property Office, the disclosure of which is incorporated herein by reference.

BACKGROUND OF THE INVENTION

1. Technical Field

The present invention relates to an integrated circuit (IC), and more particularly, to an IC that has a memory cell array capable of simultaneously performing a data read operation and a data write operation.

2. Discussion of the Related Art

General synchronous random access memories (SRAMs) can transmit either read data or write data during each period of a clock signal. A double data rate (DDR) RAM increases a data transmission rate of an SRAM by transmitting data at both a rising edge and a falling edge of a clock signal. However, in a conventional memory device such as an SRAM, data input and output are performed via one input and output (I/O) pin. When using a common I/O pin, data that is input and output cannot be independently controlled. Thus, input and output frequencies of the data (e.g., bandwidth) are limited.

As the bandwidth of memory devices becomes important, memory devices using separate I/Os have been manufactured. In such memory devices, an input pin and an output pin are positioned separately on the memory device so data that is input and output can be independently controlled. A memory device that has separate input and output pins can receive, for example, a read command, a read address, a write command, a write address, and can write data within one period of a clock signal, thus increasing its operating frequency.

However, when a memory device having separate I/Os receives a read command, a read address, a write command, a write address, and writes data within one period of a clock signal, memory cell accesses are performed twice, resulting in a data read operation and a data write operation being performed within one period of a clock signal. Thus, because the activation of a word line for data reading and writing is performed twice within one period of a clock signal, the clock frequency is limited by the activation time of a word line.

FIG. 1 is a timing diagram illustrating an operation of a memory device having separate I/Os. Because the relationship between an address and a word line or the latency of input and output data vary according to the structure of the memory device, such a relationship or latency is not discussed.

Referring to FIG. 1, a write address WADD and a read address RADD are input within one period of a clock signal CLK. Addresses A0, A2, A4, and A6 input at a rising edge of the clock signal CLK are read addresses RADDs, and addresses A1, A3, A5, and A7 input at a falling edge of the clock signal CLK are write addresses WADDs. A read selection signal RES is used to select the read addresses RADDs, and a write selection signal WES is used to select the write address WADDs, respectively. A word line WL having a word line pulse AWL0 for data reading and a word line pulse AWL1 for data writing is activated within one period of the clock signal CLK. Thus, one period of the clock signal CLK cannot be shorter than the activation time of the word line WL.

SUMMARY OF THE INVENTION

According to one aspect of the present invention, there is provided an integrated circuit to which inputs and outputs (I/Os) are separately provided and to which a write address and a read address are simultaneously input during one period of a clock signal, the integrated circuit comprises a plurality of memory blocks, each of the memory blocks comprises a plurality of sub-memory blocks; a plurality of data memory blocks corresponding to the memory blocks; and a tag memory controlling unit, which writes data to the memory blocks or reads data from the memory blocks in response to the write address or the read address, wherein access to the same sub-memory block is not simultaneously performed when the write address and the read address are the same.

The sub-memory blocks are a set of memory cells for sharing a common word line or bit line. In the sub-memory blocks, two or more word lines or bit lines cannot be simultaneously activated. Each of the data memory blocks has the same size as one sub-memory block. If each of the data memory blocks has the same size as one sub-memory block, the data memory blocks have a number of columns and rows different from a number of columns and rows of the sub-memory block. The tag memory controlling unit has the same number of decoding addresses as a number of addresses for decoding the data memory blocks. The tag memory controlling unit also has a number of columns and rows different from a number of columns and rows of each of the data memory blocks.

The tag memory controlling unit stores a data memory address indicating that data stored in the data memory block is originally data corresponding to the sub-memory block, and validity determination information for determining whether data stored in the data memory block is valid. If the number of the sub-memory block is 2N, each address of the tag memory controlling unit may include N+1 data bits, and N-bit of the N+1 data bits indicate a data memory address, and remaining 1-bit of the N+1 data bits indicate the validity determination information. The data memory blocks have a direct mapping relation with the sub-memory blocks. The data is input or output at a single data rate (SDR) or a double data rate (DDR).

According to another aspect of the present invention, a method for simultaneously performing a write operation and a read operation in an integrated circuit comprising a separate input and output, the method comprises: determining if a write address and a read address have been input during a period of a clock signal; determining if an upper address of the write address is the same as the upper address of the read address; and performing a write operation and a read operation during the period of the clock signal.

The method further comprises determining if the write address and the read address are the same as a data memory address, when it is determined that the upper address of the write address and the upper address of the read address are the same, wherein the write operation is performed in a data memory block and the read operation is performed in a sub-memory block when the one of the write address and the read address is not the same as the data memory address.

The method further comprises determining if one of the write address and the read address is coincident with the data memory address or if the write address and the read address are coincident with the data memory address, wherein the read operation is performed in the data memory block and the write operation is performed in a sub-memory block when the write address and the read address are not coincident with the data memory address or when one of the read address and the write address are coincident with the data memory address the operation corresponding to the address coincident with the data memory address is performed in the data memory block and the operation corresponding to the address not coincident with the data memory address is performed in the sub-memory block.

The method further comprises determining if the write address and the read address are coincident with a data memory address, when it is determined that the upper address of the write address and the upper address of the read address are not the same, wherein the write operation and the read operation are performed in different sub-memory blocks corresponding to the write address and the read address among selected memory blocks. The method further comprises determining if one of the write address and the read address is coincident with the data memory address or if the write address and the read address are coincident with the data memory address, wherein the read operation is performed in the data memory block and the write operation is performed in a sub-memory block when the write address and the read address are not coincident with the data memory address or when one of the read address and the write address are coincident with the data memory address the operation corresponding to the address coincident with the data memory address is performed in the data memory block and the operation corresponding to the address not coincident with the data memory address is performed in the sub-memory block.

BRIEF DESCRIPTION OF THE DRAWINGS

The aspects of the present invention will become more apparent by describing in detail exemplary embodiments thereof with reference to the attached drawings, in which.

DETAILED DESCRIPTION OF EXEMPLARY EMBODIMENTS

Figure 1:
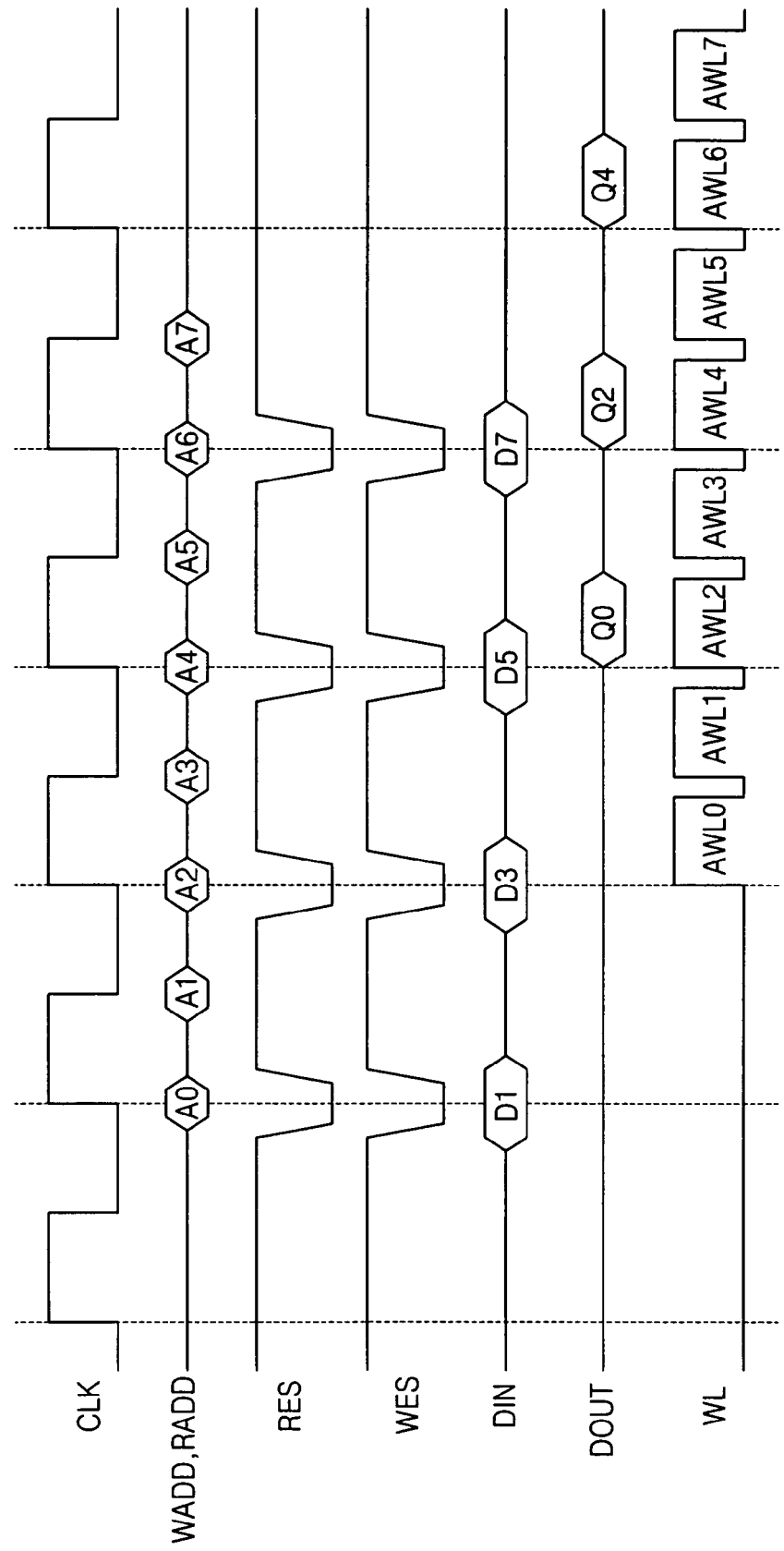
FIG. 1 is a timing diagram illustrating an operation of a memory device having separate inputs and outputs (I/Os)
Figure 2:
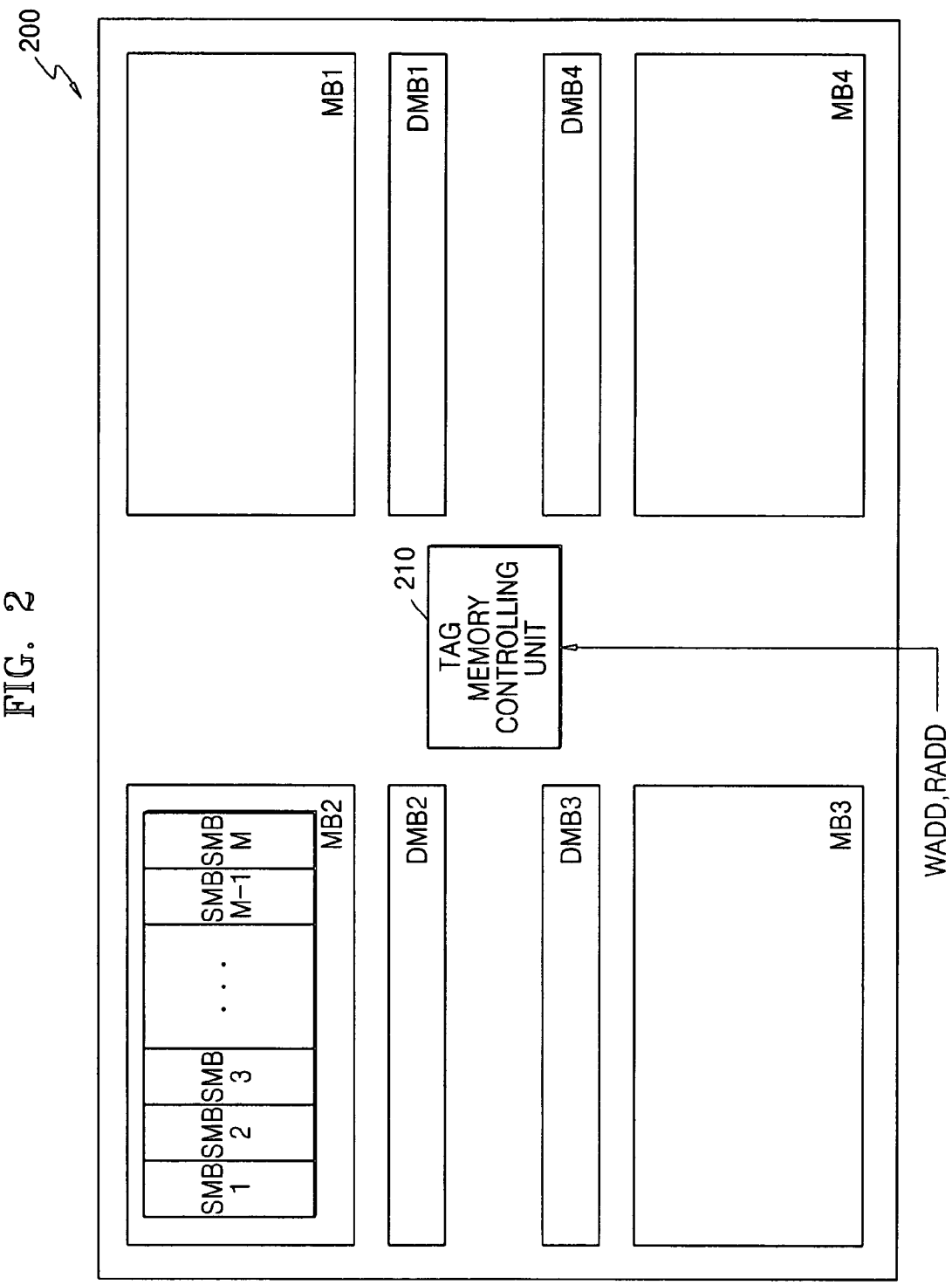
FIG. 2 is a block diagram illustrating an integrated circuit (IC) according to an exemplary embodiment of the present invention.

FIG. 2 is a block diagram illustrating an integrated circuit (IC) 200 according to an exemplary embodiment of the present invention. Referring to FIG. 2, the IC 200 includes memory blocks MB1, MB2, MB3, and MB4, each of the memory blocks MB1, MB2, MB3, and MB4 includes a plurality of sub-memory blocks SMB1, SMB2, SMB3 ... SMB M-1, and SMB M (illustrated in memory block MB2). The IC 200 also includes data memory blocks DMB1, DMB2, DMB3, and DMB4 corresponding to the memory blocks MB1, MB2, MB3, and MB4, respectively, and a tag memory controlling unit 210.

In the IC 200, separate inputs and outputs (I/Os) (not shown) are configured so that there is one input pin and one output pin, and a write address WADD and a read address RADD are input via these pins during one period of a clock signal.

The memory blocks MB1, MB2, MB3, and MB4 each have the same or similar structure, and the data memory blocks DMB1, DMB2, DMB3, and DMB4 each have the same or similar structure. Thus, in an effort to avoid repetition, the memory block MB2 (i.e., a second memory block) of the memory blocks MB1, MB2, MB3, and MB4 and the data memory block DMB2 (i.e., a second data memory block) of the data memory blocks DMB1, DMB2, DMB3, and DMB4 will be described below.

The write address WADD and the read address RADD are each divided into an upper address and a lower address and, the upper address is an address that defines one address selected from a plurality of sub-memory blocks. In accordance with the present invention, when the write address WADD and the read address RADD are the same, a data read operation and a data write operation are simultaneously performed in a memory block (e.g., MB2) and a data memory block (e.g., DMB2) so that a period of a clock signal is reduced. In other words, when the write address WADD and the read address RADD are the same, the data write operation and the data read operation are simultaneously performed in one sub-memory block (e.g., SMB2). Thus, if the data read operation is performed in the sub-memory block SMB2, the data write operation is performed in the data memory block DMB2 corresponding to the sub-memory block SMB2 and the memory block MB2.

Conversely, if the data write operation is performed in the sub-memory block SMB2, the data read operation is performed in the data memory block DMB2 corresponding to the sub-memory block SMB2. In this manner, the data read operation and the data write operation are performed simultaneously and in parallel. Thus, a period of a clock signal is reduced.

Accordingly, a predetermined memory cell of the sub-memory block SMB2 is directly-mapped to a predetermined memory cell of the data memory block DMB2. In addition, the data write operation and the data read operation are continuously performed in the same sub-memory block. Thus, the size of a data memory block (e.g., DMB2) is the same as or larger than the size of a sub-memory block (e.g., SMB2).

The tag memory controlling unit 210 determines whether the data write operation or the data read operation is performed in the sub-memory SMB2 block or the data memory block DMB2. The tag memory controlling unit 210 reads data stored in the memory blocks MB1, MB2, MB3, and MB4 and the data memory blocks DMB1, DMB2, DMB3, and DMB4 or writes data in the memory blocks MB1, MB2, MB3, and MB4 and the data memory blocks DMB1, DMB2, DMB3, and DMB4 in response to the write address WADD or the read address RADD.

When the write address WADD is the same as the read address RADD and the data read operation is performed in the sub-memory block SMB2 of the memory block MB2 and the data write operation is performed in the data memory block DMB2, an address of the sub-memory block SMB2 in which the data written in the data memory block DMB2 is originally written, is stored in the tag memory controlling unit 210 as a data memory address. Thus, the data memory address is an upper address that defines a sub-memory block SMB2 in which the data stored in the data memory block DMB2 is originally stored. In order to recognize the data memory address stored in the tag memory controlling unit 210, the position of the data memory address stored in the tag memory controlling unit 210 is identified by a low address among the input addresses.

When a subsequent write address WADD is the same as a subsequent read address RADD and the previous write address WADD is the same as the previous read address RADD, the data write operation is performed in the data memory block DMB2. In this case, data that is initially written in the data memory block DMB2 is determined to see whether it is valid data. If the data is valid data, the data initially written in the data memory block DMB2 is read and written in the sub-memory block SMB2 corresponding to the memory block MB2, and data corresponding to the next write address WADD is written in the data memory block DMB2. Information obtained after determining whether the data stored in the data memory block DMB2 is valid is stored in the tag memory controlling unit 210.

When the write address WADD is different from the read address RADD, two different sub-memory blocks corresponding to the write and read addresses WADD and RADD are decoded. Accordingly, in the IC 200 a write address decoding path (not shown) and a read address decoding path (not shown) are separate. The sub-memory blocks SMB1, SMB2, SMB3 . . . SMB M-1, and SMB M are connected to each of the write address decoding path and the read address decoding path and, data is input or output via an input pin or an output pin at a single data rate (SDR) or a double data rate (DDR).

Figure 3:
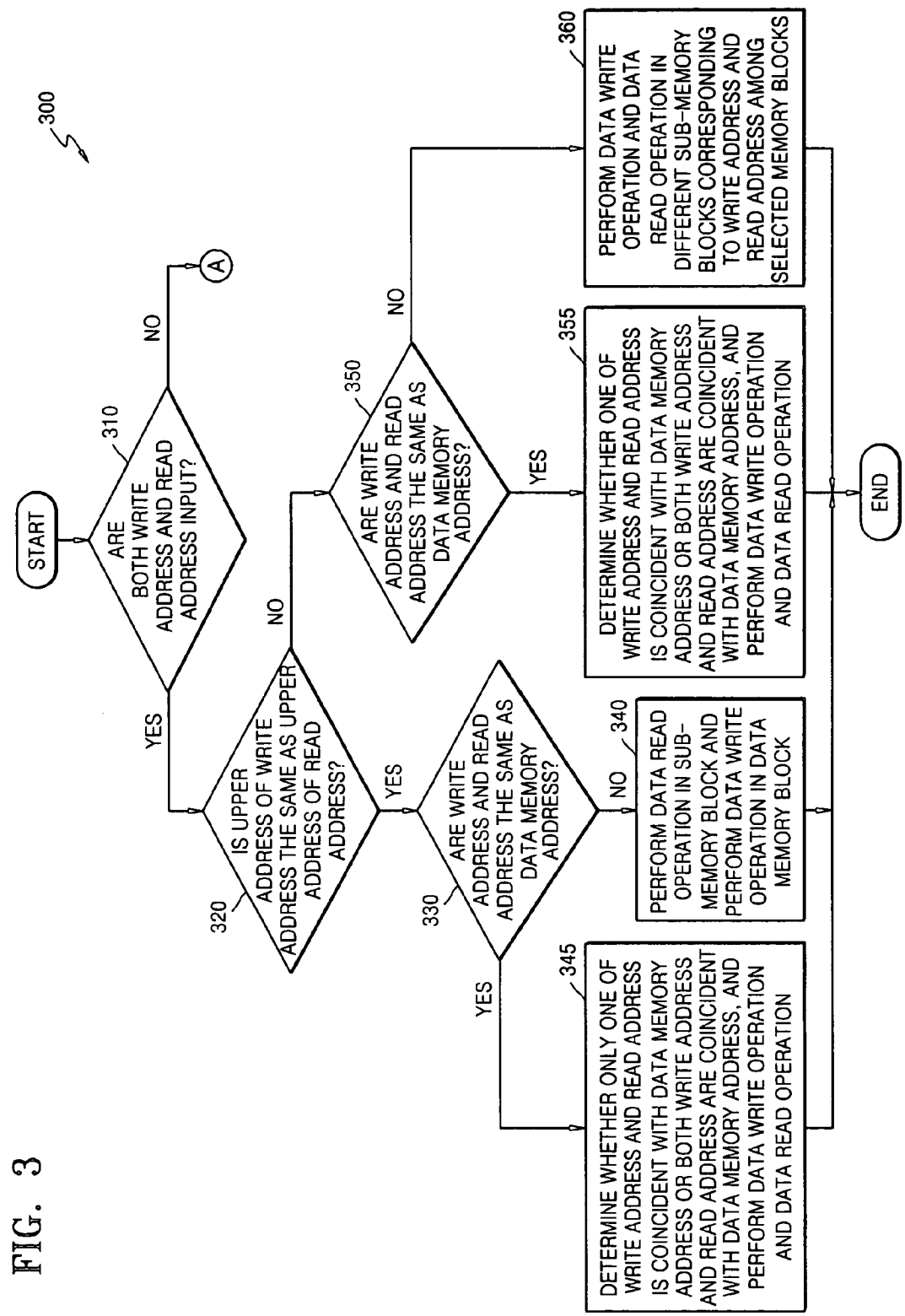
FIG. 3 is a flowchart illustrating a method of simultaneously performing data read and write operations using the IC shown in FIG. 2 according to an exemplary embodiment of the present invention.
Figure 3:
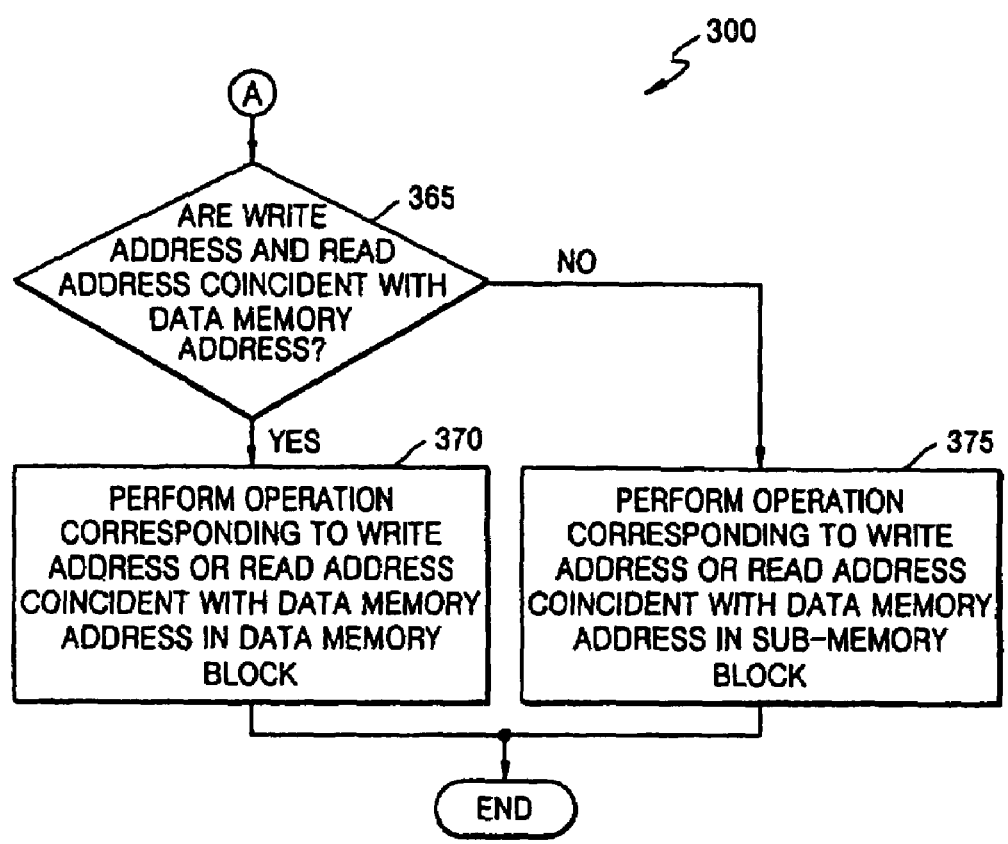

FIG. 3 is a flowchart illustrating a method of simultaneously performing a data read operation and a data write operation using the IC 200 according to an exemplary embodiment of the present invention. In process 310, it is determined whether both a write address WADD and a read address RADD are input or if the write address WADD or the read address RADD is input during one period of a clock signal. The tag memory controlling unit 210 then receives a write address WADD and a read address RADD via, for example, an input pin separate from an output pin. If the write address WADD and the read address RADD are input during one period of a clock signal, in process 320, it is determined whether an upper address of the write address WADD is the same as an upper address of the read address RADD.

The write address WADD or the read address RADD has information that is used to define a sub-memory block in its upper bits. Thus, if the write address WADD or the read address RADD is input, the upper address of the write address WADD or the read address RADD is recognized, and it is determined what sub-memory block is to be defined. If the upper address of the write address WADD is the same as the upper address of the read address RADD, in process 330, it is determined whether the write address WADD and the read address RADD are the same as a predetermined data memory address.

If the upper address of the write address WADD is the same as the upper address of the read address RADD, the write address WADD and the read address RADD define the same sub-memory block. In this case, a data write operation or a data read operation is performed in a sub-memory block, and the other operation (e.g., a data write or a data read) is performed in a data memory block.

The tag memory controlling unit 210 stores a data memory address. The data memory address represents an address of a sub-memory block SMB2 that corresponds to, for example, the data memory block DMB2. If the write address WADD is the same as the data memory address, the data write operation is performed in the data memory block DMB2.

If one of the write address WADD and the read address RADD is not the same as the data memory address, in process 340, the data read operation is performed in the sub-memory block corresponding to the read address RADD, and the data write operation is performed in the data memory block.

Figure 4:
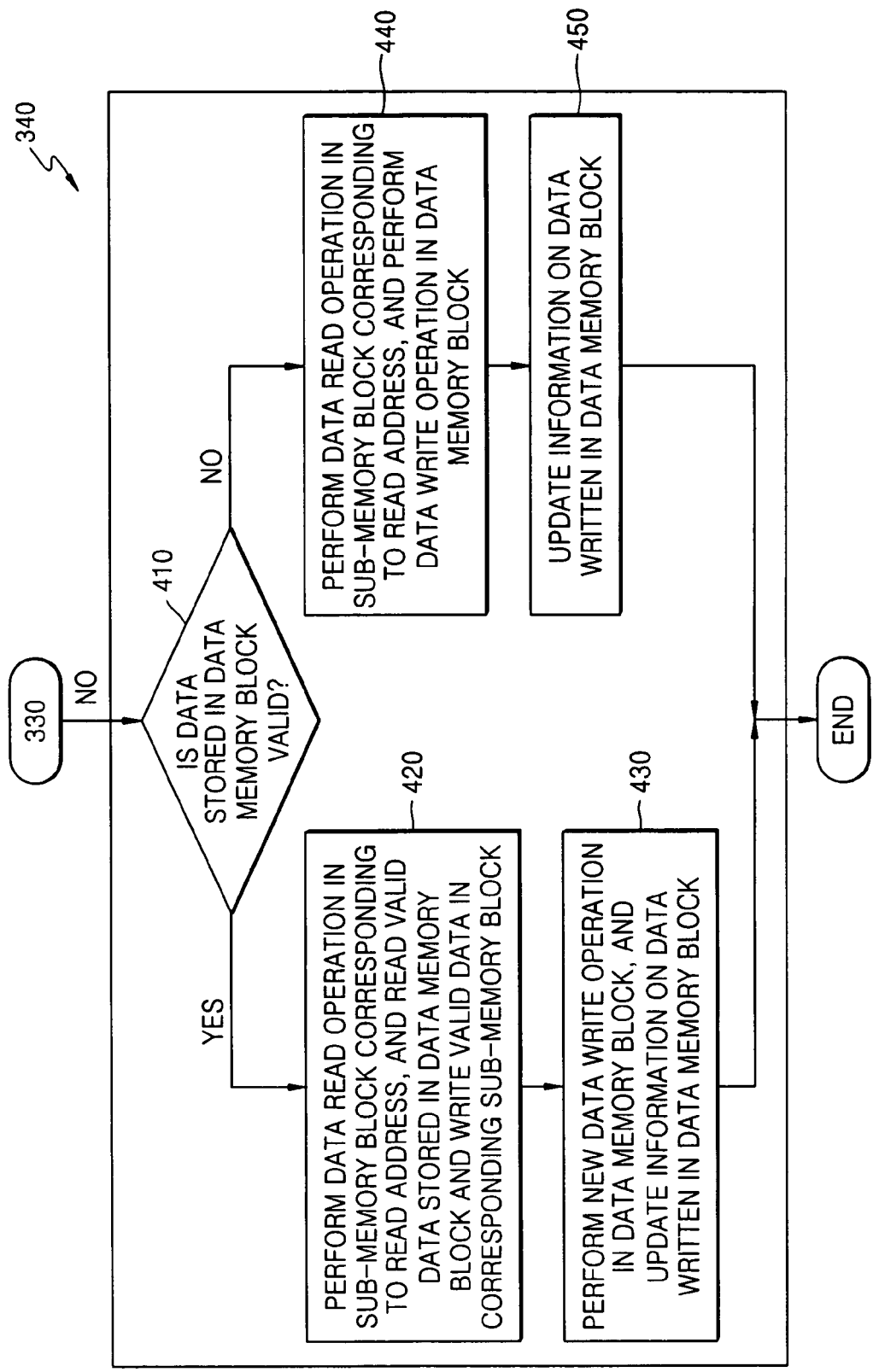
FIG. 4 is a flowchart illustrating process 340 shown in FIG. 3.

Process 340 will be described in greater detail with reference to FIG. 4. If the write address WADD or the read address RADD is not the same as the data memory address, in process 410, it is determined whether data stored in the data memory block is valid. If the write address WADD or the read address RADD is not the same as the data memory address, this indicates that the data read operation and the data write operation is to be performed in the sub-memory block SMB2 of the memory block MB2. However, a write word line and a read word line cannot be simultaneously enabled in the same sub-memory block. Thus, the data memory block DMB2 is used.

If the data stored in the data memory block is not valid, in process 440, the data read operation is performed in the sub-memory block corresponding to the read address RADD, and the data write operation is performed in the data memory block. When the data write operation and the data read operation are performed in the same sub-memory block, the data read operation is performed first. Thus, the data read operation is performed in the sub-memory block SMB2 of the memory block MB2 corresponding to the read address RADD. Because the data stored in the data memory block DMB2 is not valid, the data write operation is performed in the data memory block DMB2.

Because the data stored in the data memory block DMB2 is changed by a new data write operation, in process 450, information regarding the data written in the data memory block is updated. Updating the information is performed by the tag memory controlling unit 210.

If the data stored in the data memory block is valid, in process 420, the data read operation is performed in the sub-memory block corresponding to the read address RADD, and the valid data stored in the data memory block is read and written in the corresponding sub-memory block. When the data write operation and the data read operation are performed in the same sub-memory block, the data read operation is performed first. Thus, the data read operation is performed in the sub-memory block SMB2 of the memory block MB2 corresponding to the read address RADD. Because the data stored in the data memory block DMB2 is valid data, the valid data stored in the data memory block DMB2 is read, and the read data is written in the corresponding sub-memory block SMB2 of the memory block MB2.

In process 430, a new data write operation is performed in the data memory block DMB2, and information regarding the data written in the data memory block DMB2 is updated. Updating the information is performed by the tag memory controlling unit 210.

The data write operation and the data read operation are simultaneously performed. In other words, because the data write operation and the data read operation are independently performed in the sub-memory block SMB2 and the data memory block DMB2, the write word line and the read word line are simultaneously enabled. Thus, the write word line and the read word line are sequentially enabled such that the period of a clock signal is not limited.

If the write address WADD or the read address RADD is coincident with the data memory address in process 330, in process 345, it is determined whether only one of the write address WADD or the read address RADD is coincident with the data memory address or if both the write address WADD and the read address RADD are coincident with the data memory address, then the data write operation and the data read operation are performed.

Figure 5:
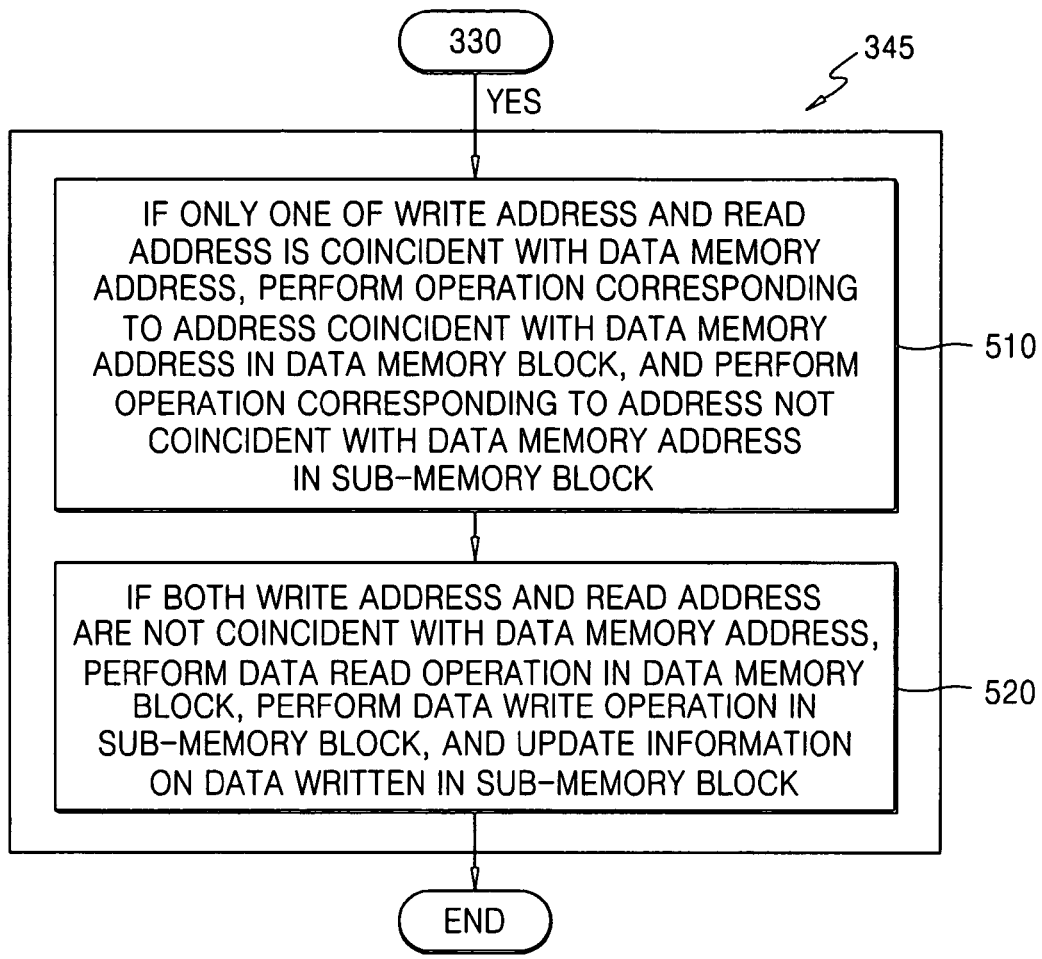
FIG. 5 is a flowchart illustrating process 345 shown in FIG. 3.

Process 345 will be described in greater detail with reference to FIG. 5. If the write address WADD or the read address RADD is coincident with the data memory address, in process 510, an operation corresponding to an address coincident with the data memory address is performed in the data memory block DMB2, and an operation corresponding to an address not coincident with the data memory address is performed in the sub-memory block SMB2. In other words, if the read address RADD is coincident with the data memory address and the write address WADD is not coincident with the data memory address, the data read operation is performed in the data memory block DMB2.

Conversely, if the write address WADD is coincident with the data memory address and the read address RADD is not coincident with the data memory address, the data write operation is performed in the data memory block DMB2, and the data read operation is performed in the memory block MB2.

If the write address WADD and the read address RADD are not coincident with the data memory address, in process 520, the data read operation is performed in the data memory block DMB2, the data write operation is performed in the sub-memory block SMB2, and information on the data written in the sub-memory block SMB2 is updated. If, however, the write address WADD and the read address RADD are coincident with the data memory address, the data write operation and the data read operation is performed in the data memory block DMB2.

This, however, does not occur because the data write operation and the data read operation cannot be simultaneously performed in the same sub-memory block. Thus, the data read operation is performed in the data memory block DMB2 and, the data write operation is performed in the corresponding sub-memory block SMB2 of the memory block MB2.

Because the data that was to be originally written in the data memory block DMB2 is written in the sub-memory block SMB2, the data currently stored in the data memory block DMB2 is not valid data. Thus, this information is updated by the tag memory controlling unit 210.

In process 320, if the upper address of the write address WADD is not the same as the upper address of the read address RADD, in process 350, it is determined whether the write address WADD and the read address RADD are coincident with the data memory address. In process 355, it is determined whether one of the write address WADD and the read address RADD is coincident with the data memory address or both the write address WADD and the read address RADD are coincident with the data memory address, then the data write operation and the data read operation are performed.

Figure 6:
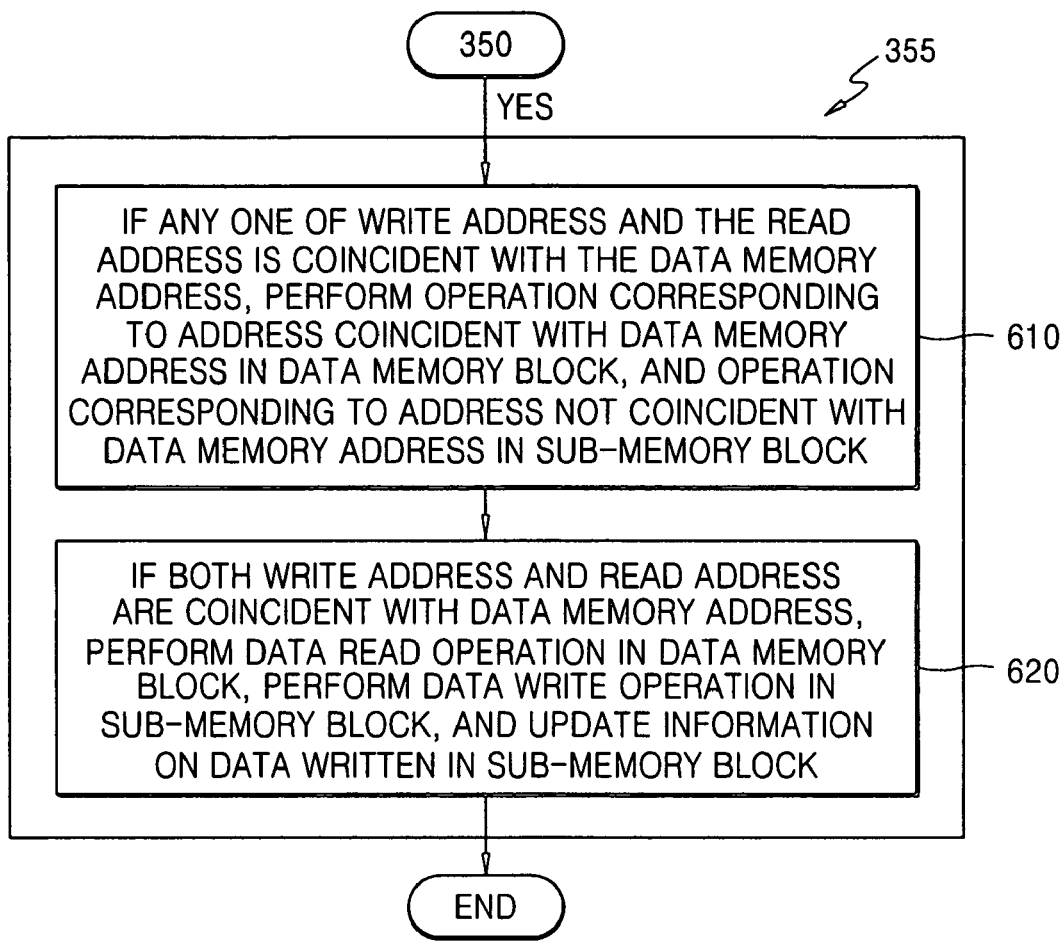
FIG. 6 is a flowchart illustrating process 355 shown in FIG. 3.

Process 355 will be described in greater detail with reference to FIG. 6. If any one of the write address WADD and the read address RADD is coincident with the data memory address, in process 610, an operation corresponding to an address coincident with the data memory address is performed in the data memory block DMB2, and an operation corresponding to an address not coincident with the data memory address is performed in the sub-memory block SMB2. In other words, if the read address RADD is coincident with the data memory address and the write address WADD is not coincident with the data memory address, the data read operation is performed in the data memory block DMB2. In addition, the tag memory controlling unit 210 performs the data write operation in the sub-memory block SMB2.

Conversely, if the write address WADD is coincident with the data memory address and the read address RADD is not coincident with the data memory address, the data write operation is performed in the data memory block DMB2, and the data read operation is performed in the sub-memory block SMB2. If both the write address WADD and the read address RADD are coincident with the data memory address, in process 620, the data read operation is performed in the data memory block DMB2, the data write operation is performed in the sub-memory block SMB2, and information on the data written in the sub-memory block SMB2 is updated.

If both the write address WADD and the read address RADD are coincident with the data memory address, the data write operation and the data read operation are performed in the data memory block DMB2. However, because the data write operation and the data read operation cannot be simultaneously performed in the same sub-memory block, the data read operation is performed in the data memory block DMB2 and, the data write operation is performed in the corresponding sub-memory block SMB2 of the memory block MB2.

Because the data that was to be originally written in the data memory block DMB2 is written in the sub-memory block SMB2, the data currently stored in the data memory block DMB2 is not valid data. Thus, the information is updated by the tag memory controlling unit 210.

As a result of the determination in process 350, if the write address WADD and the read address RADD are not coincident with the data memory address, in process 360, a data write operation and a data read operation are performed in different sub-memory blocks corresponding to the write address WADD and the read address RADD among the selected memory blocks. In this case, the write address WADD and the read address RADD define different sub-memory blocks. Because the different sub-memory blocks are now defined, a data read operation and a data write operation are performed using a decoding circuit (not shown) corresponding to each sub-memory block.

In process 310, if the write address WADD or the read address RADD is input, in process 365, it is determined whether one of the write address WADD and the read address RADD is coincident with the data memory address. If the input write address WADD or read address RADD is coincident with the data memory address, in process 370, an operation corresponding to the write address WADD or read address RADD coincident with the data memory address is performed in the data memory block DMB2.

In this case, the write address WADD or the read address RADD is input during one period of a clock signal. If the input address is coincident with the data memory address, the operation corresponding to the data memory block DMB2 is performed, and if the input address is not coincident with the data memory address, the operation corresponding to the sub-memory block SMB2 is performed. In other words, if only the write address WADD is input and the input write address WADD is coincident with the data memory address, the data write operation is performed in the data memory block DMB2. Conversely, if only the read address RADD is input and the input read address RADD is coincident with the data memory address, the data read operation is performed in the data memory block DMB2.

If the input write address WADD or read address RADD is not coincident with the data memory address, in process 375, an operation corresponding to the write address WADD or read address RADD not coincident with the data memory address is performed in the sub-memory block SMB2.

A sub-memory block, a data memory block, and a tag memory controlling unit for performing the internal operation of an IC for use with the present invention will now be described.

Figure 7:
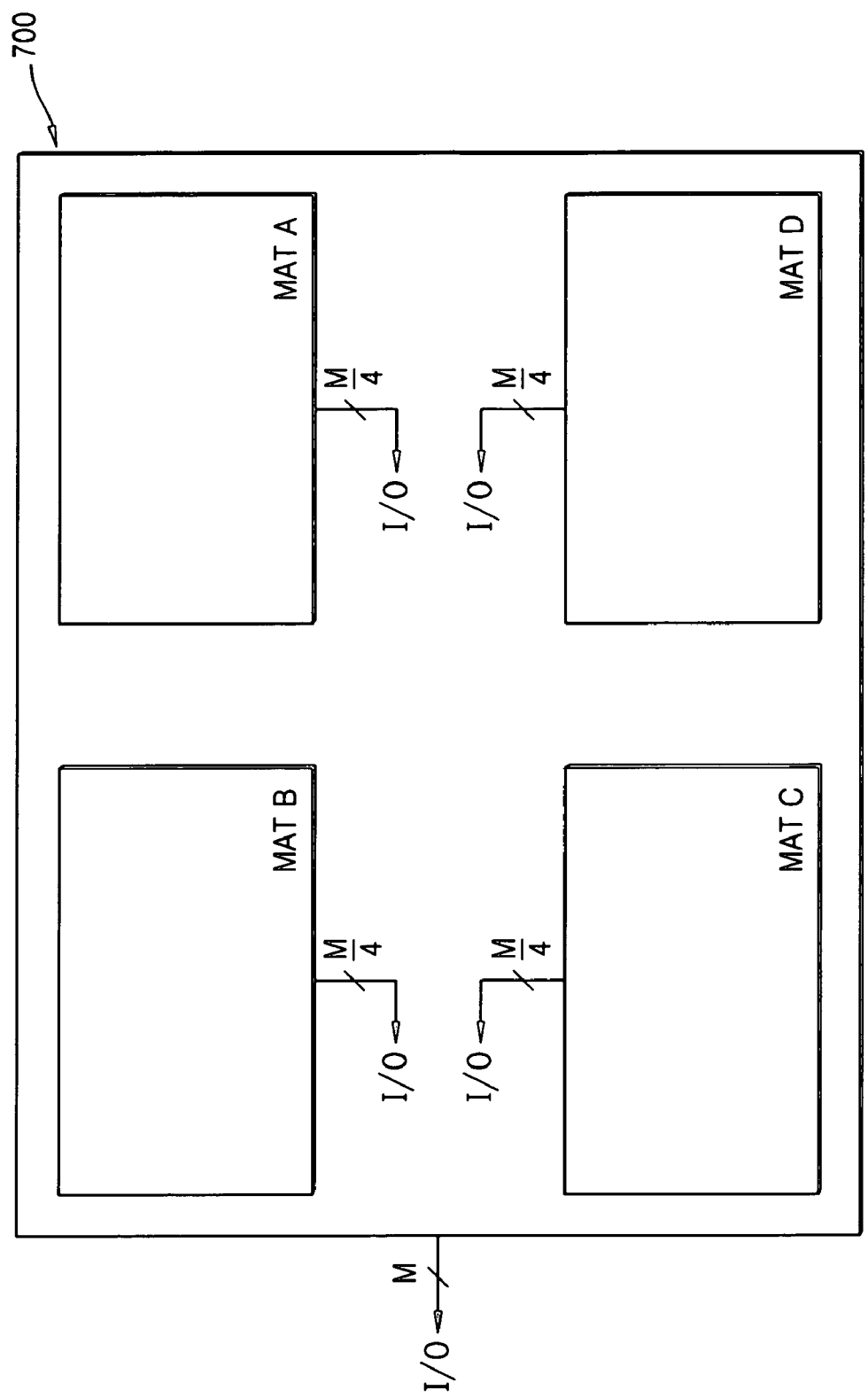
FIG. 7 is a block diagram illustrating a memory of an IC according to an exemplary embodiment of the present invention.

FIG. 7 is a block diagram illustrating a memory of an IC 700, which may be used with or in place of the IC 200 of FIG. 2, according to an exemplary embodiment of the present invention. In FIG. 7, a tag memory controlling unit is not included in an effort to avoid repetition. It is to be understood, however, that a tag memory controlling unit such as the unit 210 of FIG. 2 can be included in the memory of FIG. 7

As shown in FIG. 7, memory blocks MAT A, MAT B, MAT C, and MAT D correspond to the memory blocks MB1, MB2, MB3, and MB4 of FIG. 2. The memory blocks MAT A, MAT B, MAT C, and MAT D include cells in which data used to define a memory is stored, and a plurality of sub-memory blocks which are similar to the sub-memory blocks shown in the second memory block MB2 of FIG. 2.

Even though simultaneously-input write addresses and read addresses are the same (e.g., the have the same addresses), access to the same sub-memory block is not simultaneously performed. Specifically, two or more word lines or bit lines cannot be simultaneously activated in the same sub-memory block. As two or more word lines or bit lines are simultaneously activated in the same sub-memory block, a data write operation or a data read operation is performed on a plurality of cells in one sub-memory block.

Sub-memory blocks (e.g., the sub-memory blocks of FIG. 2) may be a set of memory cells for sharing a common word line so that two or more word lines or bit lines are not simultaneously activated. Alternatively, sub-memory blocks may be a set of memory cells for sharing a common bit line so that two or more word lines or bit lines are not simultaneously activated. Each sub-memory block includes a plurality of I/Os. If the number of I/Os of the IC 700 is, for example, 36 and one sub-memory block includes nine I/Os, thus four sets of sub-memory blocks are needed, as shown in FIG. 7. It is to be understood that a set of sub-memory blocks is referred to as a MAT.

In FIG. 7, one MAT includes a plurality of sub-memory blocks. The number of I/Os output from one MAT is nine. A plurality of sub-memory blocks of one MAT are connected to one of the nine I/Os. One data memory block corresponds to one MAT. The size of a data memory block is the same as the size of one sub-memory block. For example, if one MAT includes 16 sub-memory blocks, the size of a data memory block is $\frac{1}{16}$ the size of one MAT. Since four MATs and four data memory blocks are in the IC 700 of FIG. 7, the size of a data memory block is $\frac{1}{16}$ the size of a memory block, i.e., four MATs, shown in the IC 700.

A data memory block has the same size as that of a sub-memory block because a data write operation and a data read operation cannot be simultaneously performed in one sub-memory block. The data memory block has the same size as that of a sub-memory block so that the data write operation and the data read operation can be simultaneously performed in a sub-memory block. In addition, a data memory block has the same size as that of one sub-memory block enabling a determination based on a comparison operation and an internal operation of a tag memory controlling unit to be quickly performed.

Figure 8:
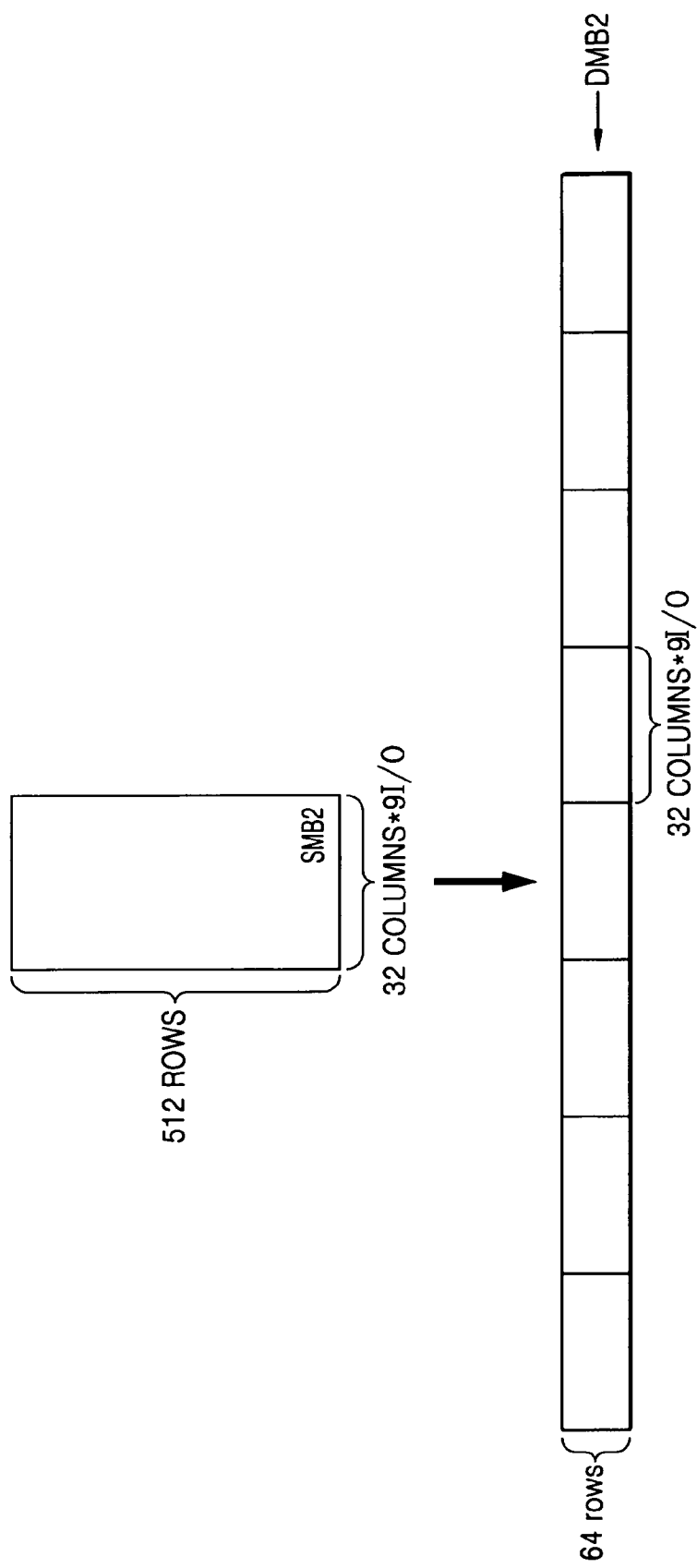
FIG. 8 illustrates mapping of a sub-memory block and a data memory block according to an exemplary embodiment of the present invention.

FIG. 8 illustrates mapping of a sub-memory block SMB2 and a data memory block DMB2 according to an exemplary embodiment of the present invention. If the data memory block DMB2 has the same size as that of the sub-memory block SMB2, the data memory block DMB2 has a number of columns and rows different from the number of columns and rows of the sub-memory block SMB2.

For example, if the sub-memory block SMB2 includes 32 columns, 512 rows, and 9 I/Os, the number of cells contained in one sub-memory block SMB2 is expressed as 32×512× 9=147,456. Where 512 cells are connected to one bit line such that a cell access time increases. Thus, because the size of a cell array of the data memory block DMB2 is not large, in the data memory block DMB2, 512 rows are changed into 64 rows, an address of the sub-memory block SMB2 corresponds to an address of the data memory block DMB2 using direct address mapping so that an access time of the data memory block DMB2 can be reduced.

In the memory blocks MAT A, MAT B, MAT C, and MAT D (of FIG. 7) having sub-memory blocks, due to the limitation of the size of the IC 700 or an aspect ratio of the IC 700, it is difficult to change the number of columns and rows of one sub-memory block for improvement of the cell access time. However, since the area of the data memory blocks in the IC 700 is small, re-mapping of an address is possible so that one of the data memory blocks has an optimum cell access time.

In FIG. 8, because the sub-memory block SMB2 includes 512 rows and 32 columns, the sub-memory block SMB2 includes 9 row addresses (512=29) and 5 column addresses (32=25). If the data memory block DMB2 is re-mapped, it is divided into 8 small blocks, the number of row addresses is 6 (64=26), and remaining 3 row addresses may be used as a block selection signal used to select 8 small blocks. In this way, a variety of mapping methods may be used to a structure a memory block, for example, MAT2 and MB2, having sub-memory blocks and a cell access time required for a data memory block.

A tag memory controlling unit such as unit 210 of FIG. 2 stores a data memory address indicating that data currently stored in the data memory block DMB2 is originally data corresponding to its sub-memory block SMB2, and validity determination information resulting from determining if data currently stored in the data memory block DMB2 is valid.

Thus, the space of the address occupied by the tag memory controlling unit 210 is one sub-block, similar to that of the data memory block DMB2, and the IC 700, which does not have a function to separately write for each I/O such as byte-write, only needs one tag memory controlling unit 210. However, when the IC 700 a byte-write function, the contents of the data memory block DMB2 are varied by byte, therefore the IC 700 should include a tag memory controlling unit 210 for each byte.

It is to be understood that the tag memory controlling unit 210 has the same number of decoding addresses as number of addresses for decoding the data memory block DMB2. However, the tag memory controlling unit 210 may have a number of columns and rows different from the number of columns and rows of the data memory block DMB2. In other words, the tag memory controlling unit 210 can perform re-mapping, similar to that of the data memory block DMB2, if a cell access time is required.

In re-mapping there is a difference that in the data memory block DMB2, data corresponding to one address of the sub-memory block SMB2 is I/O data, whereas the tag memory controlling unit 210 includes address data corresponding to the data memory address and valid bits corresponding to the valid determination information.

If the number of sub-memory blocks is 2N, each address of the tag memory controlling unit 210 includes N+1 data bits. N-bit of the N+1 data bits indicates a data memory address, and remaining 1-bit of the N+1 data bits indicates the valid determination information. For example, if one MAT includes 32 sub-memory blocks (in a case where N=5), each address of the tag memory controlling unit 210 includes 6 data bits, and the number of address data indicating the data memory address is 5, and the number of valid bits indicating the validity determination information is 1.

Thus, as described above with reference to FIGS. 2-8, in an IC having a memory cell according to the present invention, a data read operation and a data write operation are simultaneously performed during one period of a clock signal, such that a period of the clock signal is reduced.

While this invention has been particularly shown and described with reference to exemplary embodiments thereof, it will be understood by those skilled in the art that various changes in form and details may be made therein without departing from the spirit and scope of the invention as defined by the appended claims and equivalents thereof.

What is claimed is:

1. An integrated circuit to which inputs and outputs (I/Os) are separately provided and to which a write address and a read address are simultaneously input during one period of a clock signal, the integrated circuit comprising:
   a plurality of memory blocks, each of the memory blocks comprising a plurality of sub-memory blocks;
   a plurality of data memory blocks corresponding to the memory blocks, wherein each of the data memory blocks has the same size as a sub-memory block; and
   a tag memory controlling unit, which writes data to the memory blocks or reads data from the memory blocks in response to the write address or the read address, wherein when the write address and the read address are the same as a data memory address, the read operation is performed in the data memory block and the write operation is performed in the sub-memory block, and wherein when the write address and the read address are both not the same as the data memory address, the operation corresponding to the address that is the same as the data memory address is performed in the data memory block and the operation corresponding to the address that is not the same as the data memory address is performed in the sub-memory block.

2. The integrated circuit of claim 1, wherein the sub-in memory blocks are a set of memory cells for sharing a common word line or bit line.

3. The integrated circuit of claim 1, wherein in the sub-memory blocks, two or more word lines or bit lines cannot be simultaneously activated.

4. The integrated circuit of claim 1, wherein the data memory blocks have a number of columns and rows different from a number of columns and rows of the sub-memory block.

5. The integrated circuit of claim 1, wherein the tag memory controlling unit has a same number of decoding addresses as a number of addresses for decoding the data memory blocks.

6. The integrated circuit of claim 5, wherein the tag memory controlling unit has a number of columns and rows different from a number of columns and rows of the data memory blocks.

7. The integrated circuit of claim 1, wherein the tag memory controlling unit stores a data memory address indicating that data stored in the data memory blocks is originally data corresponding to one of the sub-memory blocks, and validity determination information for determining whether data stored in the data memory block is valid.

8. The integrated circuit of claim 7, wherein if the number of the sub-memory blocks is 2N, each address of the tag memory controlling unit includes N+1 data bits, and N-bit of the N+1 data bits indicates a data memory address, and remaining 1-bit of the N+1 data bits indicates the validity determination information.

9. The integrated circuit of claim 1, wherein the data memory blocks have a direct mapping relation with the sub-memory blocks.

10. The integrated circuit of claim 1, wherein the data is input or output at a single data rate (SDR) or a double data rate (DDR).

11. A method for simultaneously performing a write operation and a read operation in an integrated circuit having a separate input and output and a plurality of data memory blocks and a plurality of sub-memory blocks, the method comprising:
    determining if a write address and a read address have been input during a period of a clock signal;
    determining if an upper address of the write address is the same as an upper address of the read address, when the write address and the read address have been input during the period of the clock signal; and
    performing a write operation and a read operation such that upon determining that the write address and the read address are the same as a data memory address the cad operation is performed in the data memory block and the write operation is performed in the sub-memory block and upon determining that the write address and the read address are both not the same as the data memory address the operation corresponding to the address that is the same as the data memory address is performed in the data memory block and the operation corresponding to the address that is not the same as the data memory address is performed in the sub-memory block.

12. The method of claim 11, further comprising:
    determining if the write address and the read address are the same as a data memory address, when it is determined that the upper address of the write address and the upper address of the read address are the same;
    determining if only one of the write address and the read address is coincident with the data memory address or if both the write address and the read address are coincident with the data memory address, when both the write address and the read address are the same as the data memory address; and
    performing the read operation in the data memory block and the write operation in the sub-memory block during one period of the clock signal, when both the write address and the read address are not coincident with the data memory address; or
    performing an operation corresponding to the address coincident with the data memory address in the data memory block and an operation corresponding to the address not coincident with the data memory address in the sub-memory block during one period of the clock signal, when only one of the read address and the write address is coincident with the data memory address.

13. An integrated circuit to which inputs and outputs (I/Os) are separately provided and to which a write address and a read address are simultaneously input during one period of a clock signal, the integrated circuit comprising:
    a plurality of memory blocks, each of the memory blocks comprising a plurality of sub-memory blocks;

a plurality of data memory blocks corresponding to the memory block; and a tag memory controlling unit, which writes data to the memory blocks or reads data from the memory blocks in response to the write address or the read address, wherein access to the same sub-memory block is not simultaneously performed when the write address and the read address are the same, wherein the tag memory controlling unit has a same number of decoding addresses as a number of addresses for decoding the data memory blocks and a number of columns and rows different from a number of columns and rows of the data memory blocks.

* * * * *